(12) United States Patent
Otterdahl (10) Patent No.: US 12,512,794 B2
(45) Date of Patent: Dec. 30, 2025

(54) FULL-BRIDGE CLASS D AMPLIFIER

(71) Applicant: Paeonia Development AB, Veddige (SE)

(72) Inventor: Mats Otterdahl, Kungsbacka (SE)

(73) Assignee: PAEONIA DEVELOPMENT AB, Veddige (SE)

( * ) Notice: Subject to any disclaimer, the term of this patent is extended or adjusted under 35 U.S.C. 154(b) by 511 days.

(21) Appl. No.: 18/090,783

(22) Filed: Dec. 29, 2022

(65) Prior Publication Data

US 2023/0299723 A1 Sep. 21, 2023

(30) Foreign Application Priority Data

Mar. 21, 2022 (EP) ..................................... 22163284

(51) Int. Cl.
- *H03F 1/26* (2006.01)
- *H03F 3/217* (2006.01)
- *H04R 3/04* (2006.01)

(52) U.S. Cl.
CPC ............. *H03F 1/26* (2013.01); *H03F 3/2173* (2013.01); *H04R 3/04* (2013.01); *H03F 2200/03* (2013.01);
(Continued)

(58) Field of Classification Search
CPC ...... H03F 1/26; H03F 3/2173; H03F 2200/03; H03F 2200/171; H03F 2200/267;
(Continued)

(56) References Cited

U.S. PATENT DOCUMENTS

| | | | | |
|---|---|---|---|---|
| 4,968,948 A | * | 11/1990 | Tokumo | ................... H03H 7/09 330/10 |
| 7,456,685 B2 | * | 11/2008 | Chen | ....................... H03F 3/217 330/10 |

(Continued)

FOREIGN PATENT DOCUMENTS

GB 2 343 573 10/2000

OTHER PUBLICATIONS

Communication Pursuant to Article 94(3) EPC from EP Application No. 22163284.7, dated Oct. 2, 2024.
(Continued)

*Primary Examiner* — Hieu P Nguyen
(74) *Attorney, Agent, or Firm* — Westman, Champlin & Koehler, P..A.

(57) ABSTRACT

The present disclosure relates to a full-bridge class D amplifier comprising a first and second half-bridge circuit, wherein each half-bridge comprises a half-bridge output terminal between a high-side switch and a low-side switch. Wherein the first and second half-bridge circuits are controlled by a respective control signal to operate in differential mode with a predetermined switching frequency and wherein each half-bridge circuit further comprises an output terminal inductor connected between the half-bridge output terminal and ground. The amplifier further comprises a first and second coil coupled to form a common mode choke, wherein the first half-bridge output terminal is connected to an input terminal of the first coil, and wherein the second half-bridge output terminal is connected to an input terminal of the second coil.

12 Claims, 8 Drawing Sheets

(52) U.S. Cl.
CPC .. *H03F 2200/171* (2013.01); *H03F 2200/267* (2013.01)

(58) Field of Classification Search
CPC ......... H03F 2200/301; H03F 2200/309; H03F 2200/33; H03F 2200/351; H03F 2200/391; H03F 2200/402; H03F 2200/426; H03F 2200/444; H03F 2200/537; H03F 2200/541; H03F 2203/21157; H03F 2203/21172; H03F 1/0205; H03F 3/183; H03F 3/3062; H04R 3/04
USPC ........................................ 330/10, 251, 207 A
See application file for complete search history.

(56) References Cited

U.S. PATENT DOCUMENTS

| | | | | |
|---|---|---|---|---|
| 7,508,263 B2* | 3/2009 | Inoue | ...................... | H03F 3/217 330/306 |
| 7,893,764 B2* | 2/2011 | Handa | ................... | H03F 3/2173 330/251 |
| 9,059,663 B2* | 6/2015 | Munenaga | ............ | H03F 3/2173 |
| 9,496,829 B2* | 11/2016 | Plager | ................... | H03F 3/2173 |

OTHER PUBLICATIONS

"Soft-switching Single-stage Three-level Power Amplifier for High-voltage Audio Distribution Systems", by S. Guo et al., Electronics Letters, Oct. 13, 2016, vol. 52, No. 21, pp. 1797-1799.

"ZVS Tank Optimization for Class-D Amplifier in High Frequency WPT Applications", by I. Shi et al., 2021 IEEE Applied Power Electronics Conference and Exposition (APEC), Jun. 14, 2021, pp. 1593-1598, XP033944884.

Extended European Search Report from European Patent Application No. 22163284.7, dated Sep. 2, 2022.

* cited by examiner

FULL-BRIDGE CLASS D AMPLIFIER

CROSS-REFERENCE TO RELATED APPLICATION

This application claims priority to European Patent Application No. 22163284.7 filed Mar. 21, 2022, the content of which is hereby incorporated by reference in its entirety.

TECHNICAL FIELD OF THE INVENTION

The present invention relates to a full-bridge class D amplifier.

BACKGROUND OF THE INVENTION

Many different types of electronic power amplifiers are used in different applications to amplify electronic signals. A power amplifier obtains an input signal (such as an audio signal) and outputs an output signal which is an amplified version of the input signal. Ideally, the output signal of a power amplifier is a linearly amplified version of the input signal without any distortions or noise having been introduced by the amplifier. In practice, however, many power amplifiers will introduce undesired signal artifacts or noise which is present in output signal.

A simple form of power amplifier is the class A power amplifier which could be realized as a single-ended device with a single transistor. For instance, by directly controlling the gate of the transistor with the input signal a linearly amplified version of the input signal is generated between the source and drain of the transistor. A class A amplifier typically performs well in terms of keeping signal distortions at a minimum, however, this type of amplifier also features an inherently low power efficiency and consumes a substantial amount of power in standby.

Other types of power amplifiers include double ended switching amplifiers, such as class D amplifiers, which utilize at least two semiconductor switches (e.g. MOSFETs) in a half-bridge arrangement which are switched between the conducting and non-conducing state with a predetermined switching frequency wherein a respective duty cycle of the two switches depends on the input signal. By also ensuring that both switches of the class D amplifier are not in the conducting state simultaneously this type of amplifier can be designed to reach a much higher power efficiency in comparison to class A amplifiers. A drawback with class D amplifiers, however, is that the switching frequency of the semiconductor switches is superimposed on the output signal and that other signal artifacts may be present in the amplified output signal.

To circumvent the issues of the switching frequency leaking into the output signal a low-pass filter is used to filter the output signal of the class D amplifier to attenuate the switching frequency while maintaining the frequency content of the input signal. Fortunately, a high performance low-pass filter is easily realized as the switching frequency most often is much higher than any frequency of the input signal. However, the low-pass filter introduces at least some reduction in power efficiency which is especially noticeable in full-bridge implementations of class D amplifiers requiring a separate low-pass filter for each half-bridge.

Additionally, the semiconductor switches of the class D amplifier exhibit non-ideal characteristics and e.g. require a finite time to switch between the conducting and non-conducting state. To avoid the severe power losses associated with both switches of a half-bridge being temporarily in the conducting state a dead time is introduced during which neither switch is conducting. While introduction of a dead time provides each semiconductor switch with sufficient time to switch between their respective states without the risk of simultaneous conduction, the dead time will also introduce some losses in terms of power efficiency as the switches spend a portion of the time in a state which does not contribute to the signal amplification.

To this end there is a need for an improved class D amplifier which alleviates at least some of the shortcoming discussed in the above.

SUMMARY OF THE INVENTION

It is a purpose of the present disclosure to provide an improved full-bridge class D amplifier. According to a first aspect of the invention there is provided a full-bridge class D amplifier comprising a first and second half-bridge circuit. Each half-bridge circuit comprises a high-side switch and a low-side switch connected in series between a high voltage port and a low voltage port and a half-bridge output terminal is arranged between the high-side and low-side switch. The high-side switch and low-side switch of each half-bridge circuit is further configured to be switched between a conducting state and a non-conducting state, at a predetermined switching frequency, based on a first and second control signal respectively, such that for each half-bridge circuit one of the high-side switch and low-side switch is in the non-conducting state when the other one of the high-side switch and low-side switch is in the conducting state. Moreover, the first and second control signal are configured to drive the first and second half-bridge circuits in a differential mode. Each half-bridge circuit further comprises an output terminal inductor connected between the half-bridge output terminal and ground, and the full-bridge class D amplifier further comprises a first and second coil, that are coupled to form a common mode choke. Wherein the half-bridge output terminal of the first half-bridge is connected to an input terminal of the first coil, and wherein the half-bridge output terminal of the second half-bridge is connected to an input terminal of the second coil.

The control signals are based on an input signal to be amplified and in some implementations one of the control signals is delayed or phase shifted with 180 degrees (based on the input signal) to obtain the control signals suitable for driving the first and second half-bridge in differential mode.

The invention is at least partly based on the understanding that by providing each half-bridge circuit with an output inductor efficient operation of the high-side switch and low-side switch of each half-bridge is facilitated as the output inductor enables the switches to perform zero voltage switching (ZVS) with a shorter (or non-existent) dead-time. Moreover, the output inductor of each half-bridge decreases signal distortions, and especially when the input signal to be amplified has a low amplitude. As signal distortions introduces unwanted signal artifacts in the differential output signal the class D amplifier of the present invention provides more efficient operation and an amplified output signal with less distortion.

In each half-bridge the output inductor will be charged in a first state with magnetic energy when one of the switches is closed and the other switch is open. The first state is followed by a transient state which in turn is followed by a second state wherein, in the second state, the closed switch has switched to the open state and the open switch has switched to the closed state. In the transient state the stored magnetic energy of the output inductor will discharge and drive a current which counteracts the current which flowed through the inductor in the first state. This counteracting current is in line with the flow of current which is to occur in the second state, meaning that the voltage and current at the output terminal of each half-bridge is forced to approach the second state voltage and current flow throughout the transient state (which may include some amount of dead time) which mitigates signal distortion. It is understood that the output inductor is able to uphold this current flow for as long as it has stored magnetic energy left and, accordingly, any dead time period should preferably be sufficiently short so as to not fully discharge the output inductor.

Without the output inductors, any intrinsic capacitance of the switches (which may be implemented with any suitable type of transistor) will prohibit rapid voltage changes in the half-bridge which will increase the distortions. With the output inductors, a component is provided which enables more rapid discharge of any such intrinsic capacitance in the switches meaning that signal distortions are mitigated.

In addition to the output inductor of each half-bridge the amplifier further comprises two coupled coils which inherently suppress any common mode signals while allowing differential mode signals to pass through. That is, with the class D amplifier of the present invention the differential signal obtained at the output of the first and second coil will exhibit less distortion and less common mode noise in comparison to traditional class D amplifiers without the coupled coils and the output inductors. At the same time, as described above, the output inductor enables the switches to operate with minimal deadtime and with minimal switching losses which means that the class D amplifier of the present invention is capable of delivering a higher amplitude differential output signal (due to the decreased dead time) and operate with higher efficiency (due to the decreased switching losses).

In some implementations, each of the first and second half-bridge circuits further comprises an output terminal capacitor connected between the output inductor and ground.

The output capacitor of each half-bridge enables the voltage swing at a point between the output inductor and output capacitor to be equal to the voltage swing at the output terminal of the half-bridge but with a smaller current load. The output capacitor prohibits the width of the voltage and current pulses at the output inductor from increasing which ensures that zero voltage switching of the half-bridge switches may continue indefinitely at decreased dead times.

In addition, each of the first and second half-bridge circuits may further comprise a snubber-circuit connected in parallel with the output capacitor.

The snubber-circuit discharges the capacitor to avoid resonance between the output inductor and output capacitor. The snubber-circuit may comprise a resistor and a capacitor in series. In general, any snubber-circuit architecture may be used and the snubber may be a passive snubber or an active snubber.

In some implementations, the full-bridge class D amplifier further comprises a first and second filter capacitor, wherein the first filter capacitor is connected between an output terminal of the first coil and ground and the second filter capacitor is connected between an output terminal of the second coil and ground.

Additionally, the first coil may exhibit a first total inductance and the second coil may exhibits a second total inductance, wherein the total inductance of the first coil and the first filter capacitor forms a first low-pass filter and the total inductance of the second coil and the second filter capacitor forms a second low-pass filter. The total inductance comprises the magnetizing inductance and any leakage inductance of the respective coil.

Accordingly, the coupled coils and the output capacitors may form part of a filter circuit that low-pass filters the differential signal of the two half-bridges. The filter circuit attenuates the high-frequency signal components of the differential signals such as the switching frequency of the operation of each half-bridge. By utilizing the leakage and magnetizing inductance of the coupled coils an enhanced filter is provided which uses the coupled coils to both suppress common mode signals and as a part of a low pass filter to suppress high frequency components.

For instance, the cutoff frequency of the first and second low-pass filter is equal to or below the switching frequency.

In some implementations, the full-bridge class D amplifier further comprises a common output capacitor connected between an output terminal of the first coil and an output terminal of the second coil.

With a common output capacitor the efficiency of the amplifier when the input signal is low or silent (i.e. close or equal to zero) is enhanced.

In some implementations, the high-side switch and low-side switch of each half-bridge is connected in parallel with a respective flyback diode.

The anode of each high-side switch flyback diode is connected to the output terminal of the half-bridge and the cathode of each low-side switch flyback diode is connected to the output terminal of the half-bridge. Accordingly, the flyback diodes enable discharging of the inductors and coils of each half-bridge circuit which prohibits sudden voltage spikes in the full-bridge class D amplifier.

In some implementations, an output terminal of the first coil and an output terminal of the second coil are connected to a respective terminal of a loudspeaker.

The class D amplifier is suitable for the amplification of audio signals which e.g. are provided to a loudspeaker element. As audio signals involve frequency content which is bound by an upper frequency limit (such as e.g. 20 kHz) and which is suitable for low-pass filtering a class D audio amplifier with low distortion, high gain and high power efficiency may be realized with the invention.

According to a second aspect of the invention there is provided a full-bridge class D amplifier system, comprising the full-bridge class D amplifier according to the first aspect and a control signal arrangement configured to generate the first and second control signal based on an input signal, wherein the first and second control signal comprises a plurality of pulses occurring with the switching frequency, and wherein a duty cycle of the pulses of the first and second control signal is based on the signal level of the input signal.

Accordingly, the control arrangement generates control signals suited for the operation of the switches directly, or the operation of a drive unit which in turn operates the switches. The control signals may be in the form a square wave or a signal which is toggled between a high and low signal value wherein the high signal level indicates that the switches of the half-bridge should be in a high state (with the high-side switch conducting and the low-side switch not conducting) and the low level indicates that the switches of the half-bridge should be in a low state (with the high-side switch not conducting and the low-side switch conducting).

In some implementations of the second aspect of the invention, the system further comprises a reference signal generator, configured to generate a reference signal which is periodic with the switching frequency, and a comparator, configured to compare the input signal with the reference signal and output a comparison signal. The comparison signal has a first signal level if the input signal is higher than the reference signal and a second signal level if the reference signal is higher than the reference signal, and wherein the duty cycle of pulses of the first and second control signal is based on the comparison signal.

Consequently, a simple and effective setup for the generation of control signals from the input signal is provided. In some implementations, the reference signal is a sawtooth wave or a triangle wave.

In some implementations, the amplifier system further comprises a first drive unit associated with the first half-bridge circuit, and a second drive unit associated with the second half-bridge circuit. Wherein the first and second drive unit is configured to generate a drive signal for the high-side switch and low-side switch, with the switching frequency, based on the duty cycle of the first and second control signal respectively. Alternatively, one drive unit may be provided for each switch or a single drive unit, configured to drive two half-bridges differentially, is provided for operation of all switches.

In some implementations each drive unit is further configured to control the high-side switch and low-side switch to simultaneously be in the non-conductive state for a predetermined dead time. The dead time may facilitate efficiency by decreasing the switching losses, however, with the e.g. the aid of output inductor of the present invention the required dead time is reduced.

BRIEF DESCRIPTION OF THE DRAWINGS

The present invention will be described in more detail with reference to the appended drawings, showing different embodiments of the invention.

DETAILED DESCRIPTION OF CURRENTLY PREFERRED EMBODIMENTS

Figure 1:
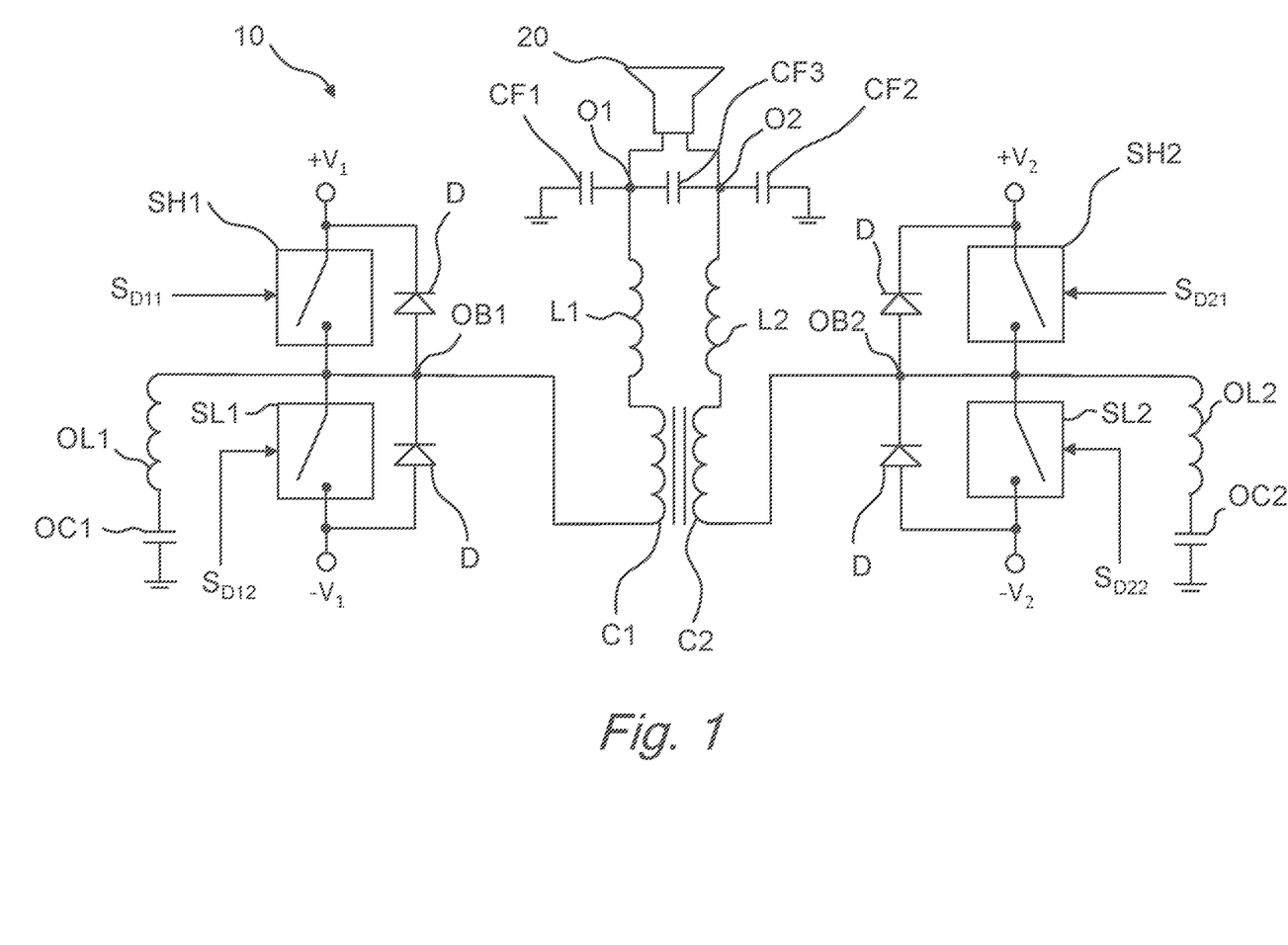
FIG. 1 is a circuit diagram of a full-bridge class D amplifier according to some implementations.

FIG. 1 depicts a full-bridge class D amplifier 10 according to some implementations. The full-bridge class D amplifier 10 comprises a first and second half-bridge wherein each half-bridge comprises a respective high-side switch SH1, SH2 and a respective low-side switch SL1, SL2.

In the first half-bridge the high-side switch SH1 and low-side switch SL1 are connected in series between the feed voltage ports $+V_1$ and $-V_1$ wherein an output terminal OB1 of the first half-bridge lies between the two switches SH1, SL1. The switches SH1, SL1 are controlled between their conductive and non-conductive state by a respective drive signal $S_{D11}$, $S_{D12}$ such that when one of the switches SH1, SL1 is in the conductive state the other one of the switches SH1, SL1 is in non-conductive state. By driving the switches SH1, SL1 in this manner simultaneous conduction is avoided which mitigates the conductive losses in the amplifier during operation.

As seen, the second half-bridge is identical to the first half-bridge and the second half-bridge also comprises a high-side switch SH2 and low-side switch SL2 on either side of an output terminal OB2 and between the feed voltage portages $+V_2$ and $-V_2$, wherein the switches SH2, SL2 are driven by a respective drive signal $S_{D21}$, $S_{D22}$.

The feed voltage ports are connected to a respective voltage source or ground and the class D amplifier 10 will thereby enable a voltage which swings between $+V_1$ and $-V_1$ at OB1 of the first half-bridge and between $+V_2$ and $-V_2$ at OB2 of the second half-bridge.

The output terminal OB1, OB2 of each half-bridge is further connected to an input port of a first and second coil C1, C2 respectively wherein the first and second coil C1, C2 are coupled to form a common mode choke. That is, the coupled coils C1, C2 will introduce a high impedance when the signals from the two half-bridges are at a high level simultaneously (common mode) whereas the coupled coils C1, C2 will introduce a low impedance when one of the signals is at a low level and the other one of the signals is a high level simultaneously (differential mode). For example, the coupled coils C1, C2 are coils wound around a common ferrite core. The coupled coils C1, C2 feature a respective (total) inductance, the (total) inductance comprises a magnetizing inductance and a leakage inductance L1, L2.

The leakage inductances L1, L2 are illustrated in FIG. 1 with physical inductor symbols L1, L2. However, the leakage inductances L1, L2 may be an inherent property of the coils C1, C2 or the leakage inductances L1, L2 may be a combination of inherent leakage inductance from the coils C1, C2 and physical inductors deliberately connected in series to the coils C1, C2.

The coupled coils C1, C2 forms part of an output filter circuit wherein the output filter circuit of the depicted embodiment further comprises filter capacitors CF1, CF2. As seen the output ports of the coupled coils C1, C2 are connected to a respective amplifier output terminal O1, O2 and a filter capacitor CF1, CF2 is connected between each amplifier output terminal O1, O2 and ground. Accordingly, the coupled coils C1, C2 establish suppression of common mode signals (which are undesirable and preferably should not be a part of the differential output signal at the amplifier output terminals O1, O2) and the inductance of the coupled coils C1, C2 forms a respective low-pass filter with the filter capacitors CF1, CF2.

In some implementations, the low-pass filter is tuned (e.g. by selection of filter capacitors CF1, CF2 and the leakage and magnetizing inductance C1, C2, L1, L2) to at least suppress frequencies that are at and above switching frequency at which the switches SL1, SL2, SH1, SH2 are operated.

Additionally, a common filter capacitor CF3 is connected between the amplifier output terminals O1, O2. It is understood that the common mode filter capacitor CF3 forms a filter suppressing differential mode signals together with the leakage inductances L1, L2. That is, in some implementations both a common mode and differential mode choke is present in the class D amplifier 10 allowing the differential output signals to be filtered so as to remove remnants of the switching frequency at which the amplifier 10 is operating. Moreover, by tuning the capacitance and inductance of the components partaking in these filters the frequency properties (e.g. the low-pass cutoff) of the filters can be adjusted to achieve properly filter out the switching frequency without affecting the signal to be amplified based on the switching frequency and the frequency content of the signal to be amplified.

The signal of the amplifier output terminals O1, O2 are connected to a speaker element 20 to output audio. However, it is envisaged that the class D amplifier 10 may be cascaded or connected to some other component in implementations other than audio signal amplification and playback.

To facilitate efficient operation each switch SL1, SL2, SH1, SH2 of each half-bridge comprises a flyback diode D to enable prohibit any sudden voltage spikes in the amplifier due to the rapid switching of the switches SL1, SL2, SH1, SH2.

The inventors have further realized that to enable zero voltage switching (ZVS) for the switches SL1, SL2, SH1, SH2 in each half-bridge an output circuit is connected between the output terminal OB1, OB2 of each half-bridge and ground. The output circuit comprises an output inductor OL1, OL2 which is connected between the output terminal OB1, OB2 of each half-bridge and ground (not shown). The output inductors OL1, OL2 stores magnetic energy and enables the switches SL1, SL2, SH1, SH2 to be operated with less dead time as the magnetic energy is released in the form of a counteracting current in the transient state of each half-bridge. The decreased dead time and the output inductors OL1, OL2 enhances the energy efficiency of the amplifier and the effect is most prominent when the full-bridge class D amplifier is turned on, but operating with a silent (flat or zero) signal. For a silent signal the output signals of each half-bridge will be in-phase and suppressed by the common mode choke formed by the coupled coils C1, C2 which will exhibit a high impedance. Consequently, as little or nor energy will be stored by the common mode choke no counteracting current will emerge in the transient state if it was not for the output inductors OL1, OL2.

Furthermore, an output capacitor OC1, OC2 is added between each output inductor OL1, OL2 and ground to ensure that the current flowing through the output circuit is lower in comparison to the output current flowing between the amplifier output terminals O1, O2 and a snubber-circuit may be added in parallel to the output capacitors OC1, OC2.

Although, the switches SL1, SL2, SH1, SH2 are depicted as ideal switches the switches may be realized with many different types of transistors, for example transistors such as MOSFETs, JFETs, BJTs, and FETs may be used. Transistors are typically based on silicon as the semiconductor material although other types of silicon material may be used such as Gallium Nitride (GaN) or Gallium Arsenide (GaAs). Especially it is noted GaN based transistors (switches) are especially suitable for operation at high voltages and high switching frequencies.

In some implementations, the low voltage feed port $-V_1$, $-V_2$ of each half-bridge connected to ground (0 volt) and the high voltage feed port $+V_1$, $+V_2$ of each half-bridge are equal and connected to e.g. a voltage of #10 volt to +300. In another implementation, the feed voltages $+V_1$ and $-V_1$ are symmetrical and the feed voltages $+V_2$ and $-V_2$ are also symmetrical. That is, $+V_1$, $+V_2$ is positive X volts and $-V_1$, $-V_2$ is negative X volts wherein X is between 10 volts to 300 volts, such as 150 volts.

It is understood that the capacitance and inductance of the different components in the full-bridge class D amplifier are selected with respect to the type of input signal, the level of signal amplification and the switching frequency at which the switches SL1, SL2, SH1, SH2 are operating.

In one exemplary embodiment, operating at a switching frequency of 300 kHz, the components are selected as OC1=OC2=50 nF, OL1=OL2=40 pH, the inherent magnetizing inductance C1=C2=500 µH, the leakage inductance L1=L2=20 µH and CF1=CF2 being in the range of 100 to 200 nF. However, it is understood that the above component values are merely exemplary and depends e.g. on the switching frequency and the type of transistors used. It is envisaged that the intrinsic capacitance of the transistors will influence the choice of components, wherein larger transistors (offering e.g. larger power capacity) would be associated with a larger intrinsic capacitance.

Figure 2A:
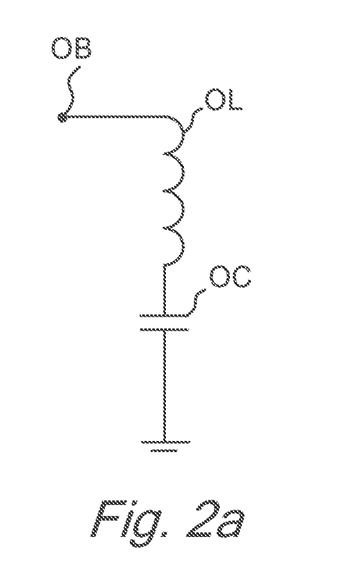
FIG. 2a is a circuit diagram of an output circuit according to some implementations of the present invention.

FIG. 2a depicts an output circuit from the full-bridge class D amplifier described in connection to FIG. 1. The output circuit comprises and output inductor OL and an output capacitor OC connected between the output terminal OB of a half-bridge and ground.

Figure 2B:
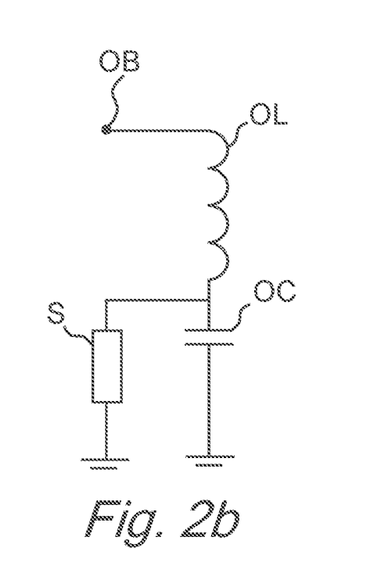
FIG. 2b is a circuit diagram of an output circuit with a snubber-circuit for discharge of the output capacitor according to some implementations of the present invention.

FIG. 2b depicts an output circuit wherein a snubber-circuit S has been added in parallel to the output capacitor OC. The snubber-circuit S prohibits resonance between the output capacitor OC and output inductor OL.

Figure 2C:
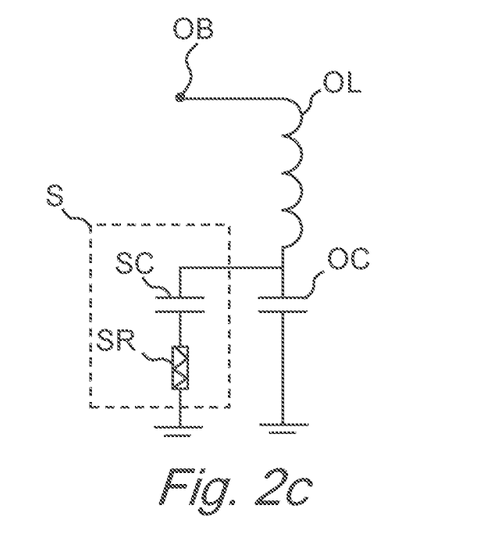
FIG. 2c is a circuit diagram of an exemplary snubber-circuit for discharge of the output capacitor according to some implementations of the present invention.

An exemplary snubber circuit S is depicted in FIG. 2c wherein the snubber circuit comprises a snubber capacitor SC and snubber resistor SR connected in series. While a snubber circuit S comprising a snubber capacitor SC and snubber resistor SR in series is one example of a passive snubber circuit S other snubber circuits (passive or active) may be used to discharge the output capacitor OC.

Figure 3:
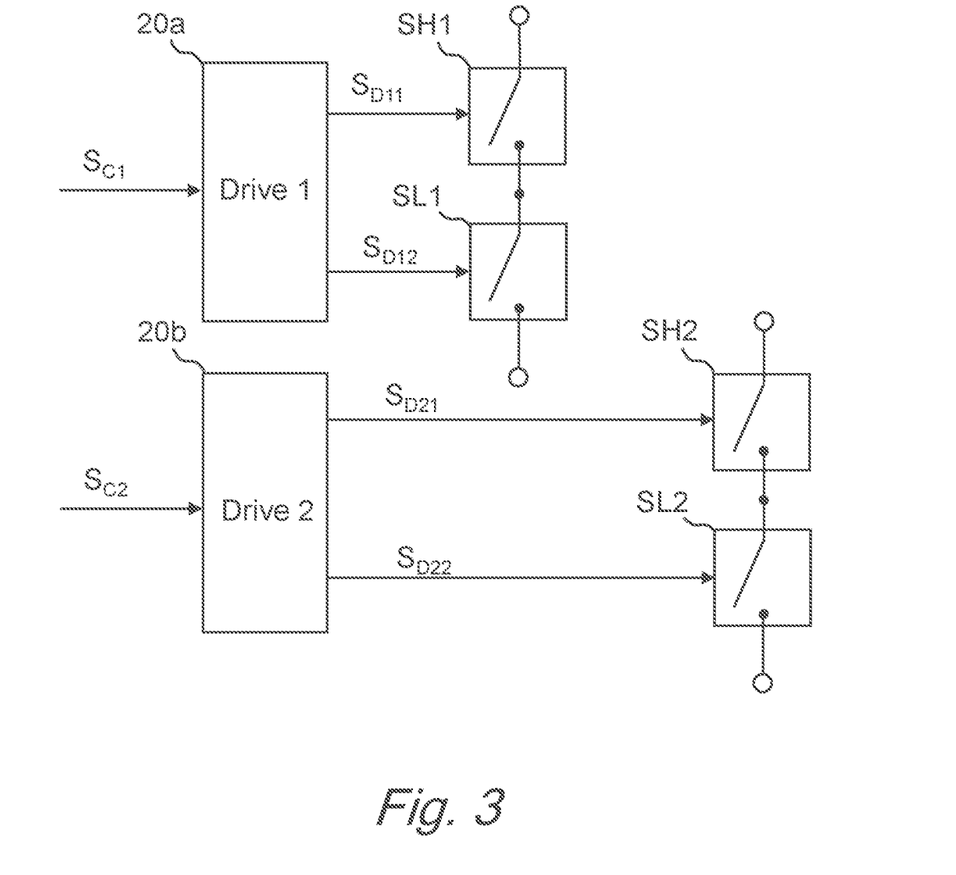
FIG. 3 is a block diagram illustrating two drive units operating the switches of a respective half-bridge.

FIG. 3 depicts two drive units 20a, 20b configured to drive the switches of the first and second half-bridge respectively. In the depicted implementation, the first drive unit 20a is configured to generate drive signals $S_{D11}$, $S_{D12}$ which control the switches SH1, SL1 of the first half-bridge and the second drive unit 20b is configured to generate drive signals $S_{D21}$, $S_{D22}$ which control the switches SH2, SL2 of the second half-bridge. Each drive unit 20a, 20b may be configured to control the switches to switch between the conductive and non-conductive state in a complementary manner meaning that when one switch is conducting (i.e. closed) the other switch is not conducting (i.e. open). Accordingly, each drive unit 20a, 20b is controllable between at least two states, a high state in which the high-side switch SH1, SH2 is conducting the low-side switch SL1, SL2 is not conducting and a low state in which the high-side switch SH1, SH2 is not conducting the low-side switch SL1, SL2 is conducting.

The drive units 20a, 20b are controlled based on the control signals $S_{C1}$, $S_{C2}$ fed to each drive unit 20a, 20b. Wherein the control signals $S_{C1}$, $S_{C2}$, in turn, are based on an input signal to be amplified. For instance, when the control signals $S_{C1}$, $S_{C2}$ are below a threshold value the drive units 20a, 20b are configured to assume the low state and when the control signals $S_{C1}$, $S_{C2}$ are above the threshold value the drive units 20a, 20b are configured to assume the high state.

Moreover, as will be described in connection to FIG. 7b in the below the drive units 20a, 20b may be configured to introduce a dead time in a transient state when switching between the high state and the low state, wherein during the dead time no switch is conducting.

While the implementation depicted in FIG. 3 uses two drive units 20a, 20b, one for each half-bridge, other setups are possible. For instance, the drive units 20a, 20b may be replaced with a single drive unit which is configured to controls all four switches SH1, SL1, SH2, SL1 in differential mode based on only one of the control signals $S_{C1}$, $S_{C2}$.

Moreover, it understood that in some implementations the switches SH1, SL1, SH2, SL1 are in the form of transistors whereby the drive units 20a, 20a are gate drive units configured to adjust the voltage applied at the gate of the transistor to thereby control the transistor between the conducting and not conducting state.

Figure 4A:
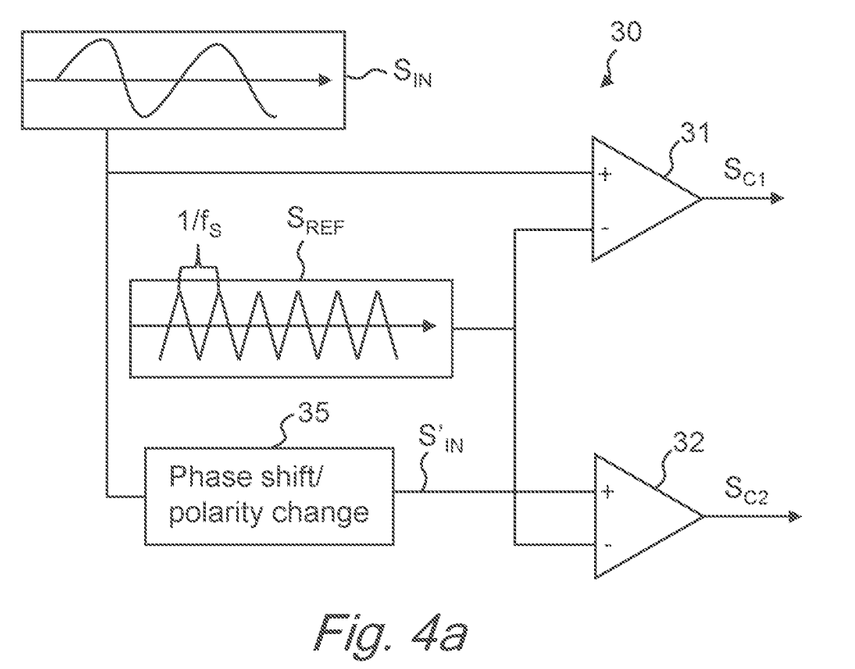
FIG. 4a is a block diagram of a first control signal arrangement for generating a first and second control signal based on an input signal, a shifted input signal and a reference signal.

FIG. 4a illustrates a control signal arrangement 30 for generating the control signals $S_{C1}$, $S_{C2}$. A time varying input signal $S_{IN}$ to be amplified is provided to a first comparator 31 which compares the input signal $S_{IN}$ with a periodic reference signal $S_{REF}$. The reference signal $S_{REF}$ is a periodic signal, such as a triangle wave, sawtooth wave, sine wave, or square wave, with a periodicity of $1/f_s$. Preferably, the switching frequency $f_s$ is higher than the highest frequency of interest in the input signal $S_{IN}$ to enable efficient filtering to separate the input signal $S_{IN}$ from the switching frequency $f_s$.

The first comparator 31 compares the input signal $S_{IN}$ and the reference signal $S_{REF}$ and outputs a first control signal $S_{C1}$ based on the comparison. For example, in each instance where the input signal $S_{IN}$ is greater than the reference signal $S_{REF}$ the first control signal $S_{C1}$ assumes a high value indicating that the driver unit should assume the high state.

The input signal $S_{IN}$ is also provided to a phase shift/polarity change unit 35 configured to for a narrow band signal output a 180 degree (or π radians) delayed representation of input signal $S_{IN}$ i.e. a shifted input signal $S'_{IN}$. Alternatively, the phase shift/polarity change unit 35 is configured to reverse the polarity of the input signal $S_{IN}$ such that high (positive voltage) signal levels in the input signal $S_{IN}$ corresponds to low (negative voltage) signal levels in the shifted input signal $S'_{IN}$.

The shifted input signal $S'_{IN}$ is provided to a second comparator 32 which compares the shifted input signal $S'_{IN}$ to the reference signal $S_{REF}$ and outputs a second control signal control signal $S_{C2}$ which is based on the comparison. For example, in each instance where the shifted input signal $S'_{IN}$ is greater than the reference signal $S_{REF}$ the second control signal $S_{C2}$ assumes a high value indicating that the associated driver unit should assume the high state.

Figure 4B:
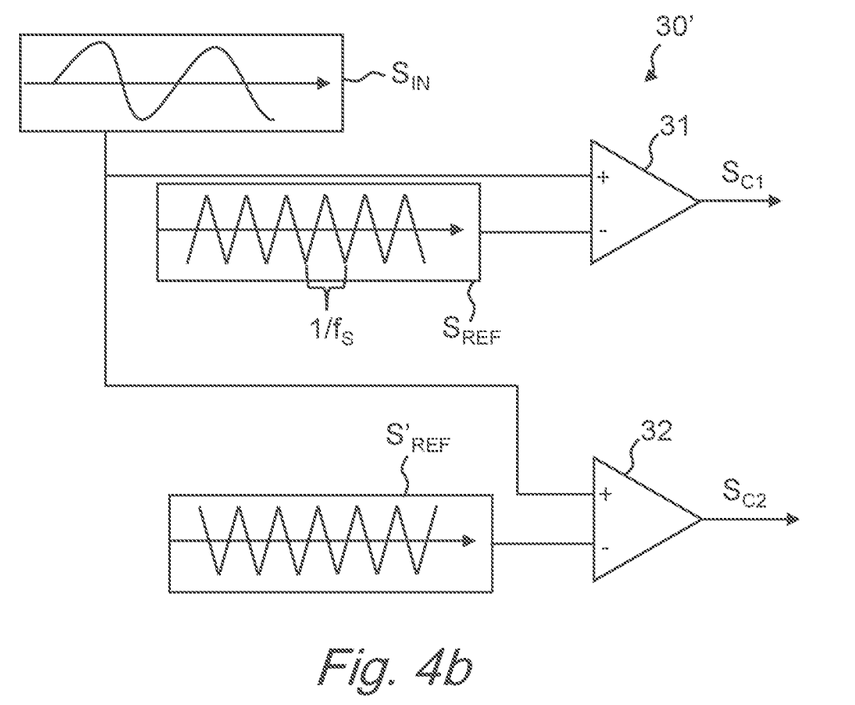
FIG. 4b is a block diagram of a second control signal arrangement for generating a first and second control signal based on an input signal, a shifted reference signal and a reference signal.

FIG. 4b depicts an alternative control signal arrangement 30' for generating the two control signals $S_{C1}$, $S_{C2}$. Instead of feeding the same reference signal $S_{REF}$ to each of the comparators 31, 32 together with the input signal $S_{IN}$ and shifted input signal $S'_{IN}$ respectively, the same input signal $S_{IN}$ will be provided to each comparator 31, 32 together with the reference signal $S_{REF}$ and a shifted reference signal $S'_{REF}$ respectively. The shifted reference signal $S'_{REF}$ is e.g. a 180 degree (i.e. π radians or $0.5/f_s$ seconds) delayed version of the reference signal $S_{REF}$ or a version of the reference signal $S_{REF}$ which has been inversed (such that high signal values become low signal values and vice versa). In the depicted embodiment of FIG. 4b the first comparator 31 is configured set the positive pulse width of the control signal $S_{C1}$ meaning that the output control signal $S_{C1}$ is in the low state by default and is adjusted to the high state when the input signal $S_{IN}$ exceeds the reference signal $S_{REF}$. The second comparator 32 is configured set the negative pulse width of the control signal $S_{C2}$ meaning that the output control signal $S_{C1}$ is in the high state by default and is adjusted to the low state when the input signal $S_{IN}$ exceeds the shifted reference signal $S'_{REF}$.

The reference signal $S_{REF}$ (and shifted reference signal $S'_{REF}$) may be created by a reference signal generator (not shown) such as a triangle wave generator or sawtooth wave generator.

The different examples of control signal arrangements 30, 30' illustrated in FIG. 4a and FIG. 4b are merely exemplary and other control signal arrangements may be used in together with the full-bridge class D amplifier of the present invention. For instance, it is understood that the exemplary control signal arrangements 30, 30' in FIG. 4a and FIG. 4b may be referred to as clocked control signal arrangements due to the presence of at least one reference signal generator which generates a repeating and clocked reference signal $S_{REF}$, $S'_{REF}$ and it is envisaged that the control signals $S_{C1}$, $S_{C2}$ may be generated in a self-oscillating manner instead.

In some implementations, and with reference to FIG. 1, a self-oscillating control signal arrangement obtains a feedback signal based on the signal at one or more of: at least one of the output terminals OB1, OB2 of the half-bridge circuits and at least one of the output terminals of the amplifier O1, O2. The feedback signal may in some implementations be fed to the self-oscillating control signal arrangement via a feedback line, the feedback line optionally comprising a feedback resistor and/or a filter. The feedback signal is provided to the self-oscillating control arrangement together with the input signal $S_{IN}$ and, based on a difference between the input signal $S_{IN}$ and the feedback signal, the control signal is generated. By configuring e.g. the filtering of the feedback signal the self-oscillation frequency is set equal to the switching frequency and, after some transient processes at start-up, the full-bridge class D amplifier will be self-oscillating and operate at the switching frequency $f_s$ without the need for a clocked reference signal generator.

A self-oscillating control signal arrangement may be realized with a smaller more compact circuit, which saves circuit board real-estate, which also is more energy efficient, which saves power. Self-oscillating control signal arrangements may also be especially well suited for operation at high switching frequencies $f_s$.

Figure 5A:
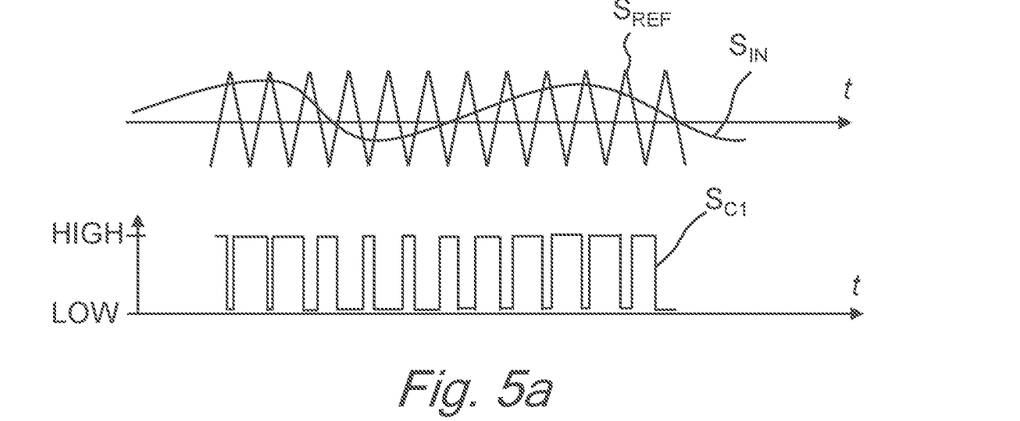
FIG. 5a illustrates in detail how a reference signal and an input signal is compared to generate a first control signal.
Figure 5B:
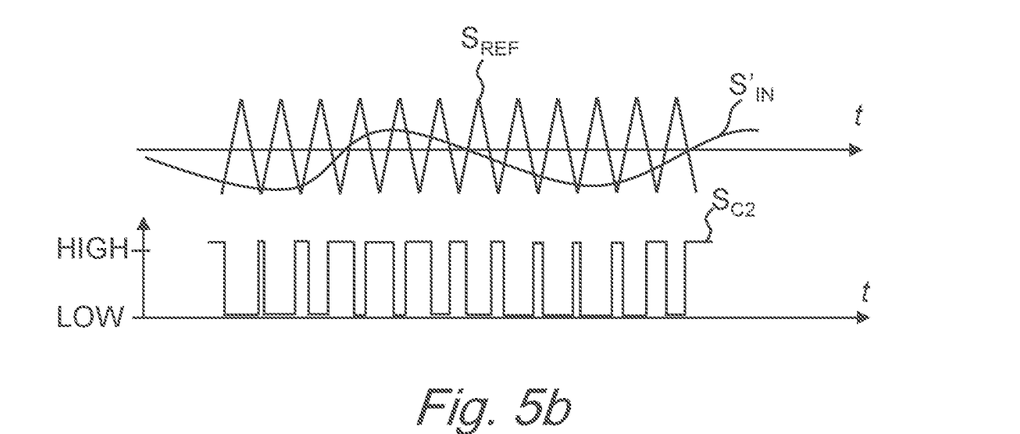
FIG. 5b illustrates in detail how a reference signal and a shifted input signal is compared to generate a second control signal.

FIGS. 5a and 5b illustrates the control signals $S_{C1}$, $S_{C2}$ and their relationship with the input signal $S_{IN}$, the shifted input signal $S'_{IN}$ and the reference signal $S_{REF}$. For instance, the control signals $S_{C1}$, $S_{C2}$ may be obtained with the control signal arrangement from FIG. 4a.

In FIG. 5a the input signal $S_{IN}$ is compared with the reference signal $S_{REF}$ and for each instance where the input signal $S_{IN}$ is greater than reference signal $S_{REF}$ the first control signal $S_{C1}$ assumes the high signal value which indicates that the high-side switch shall conduct. Accordingly, if the input signal $S_{IN}$ assumes high signal values, the input signal $S_{IN}$ will be greater than the reference signal $S_{REF}$ for longer periods of time meaning that the control signal $S_{C1}$ will assume the high signal level for a larger portion of the time. In other words, the duty cycle of the pulses of the control signal $S_{C1}$ increases for high levels of the input signal $S_{IN}$.

In FIG. 5b the shifted input signal $S'_{IN}$ is compared with the reference signal $S_{REF}$ and for each instance where the shifted input signal $S'_{IN}$ is greater than reference signal $S_{REF}$ the second control signal $S_{C2}$ assumes the high signal value which indicates that the associated half-bridge shall enter the high state.

Accordingly, one of the half-bridges will be controlled with the first control signal $S_{C1}$ to amplify large (e.g. positive) input signal levels while the other half-bridge will be controlled with the second control signal $S_{C2}$ to amplify small (e.g. negative) input signal levels.

Figure 6:
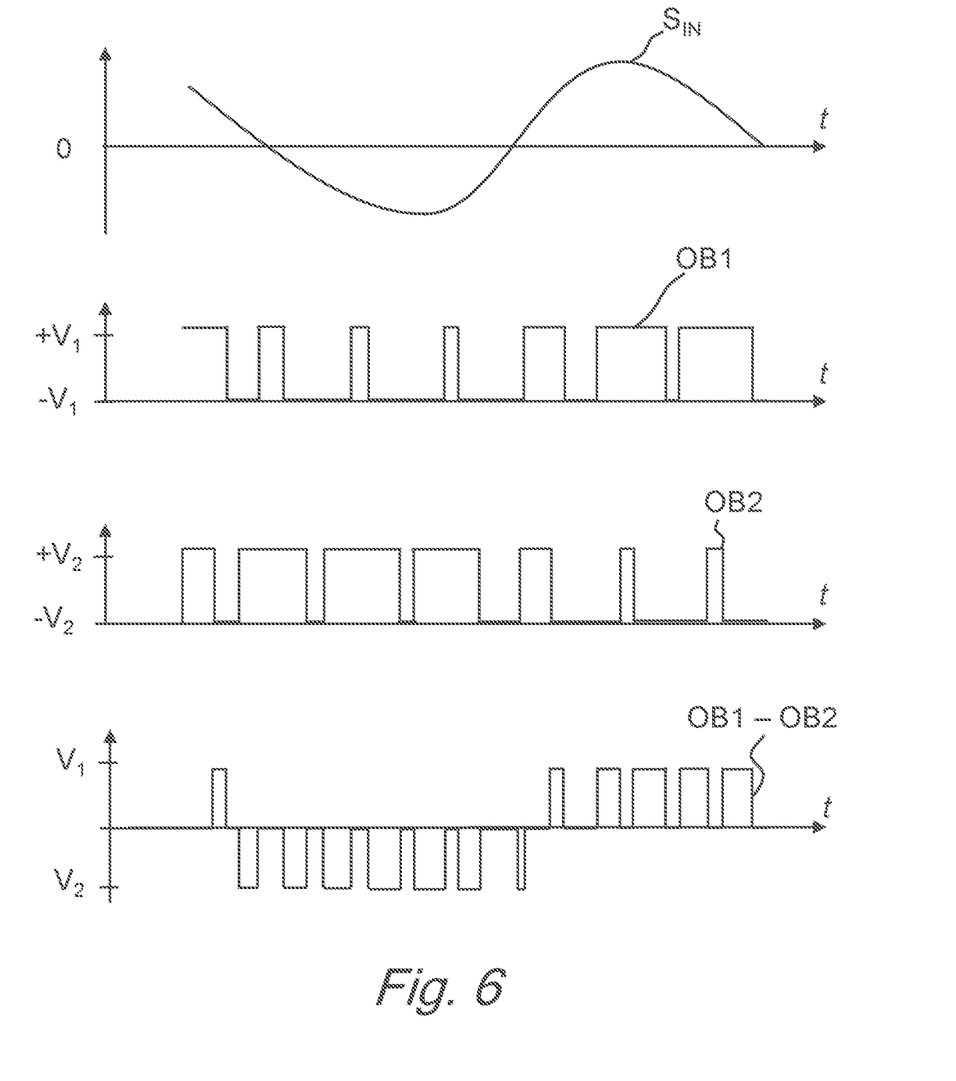
FIG. 6 illustrates the voltage swing at the output terminal of two half-bridges as a function of the input signal and the resulting differential voltage swing obtained by combining the output terminal signals of each half-bridge.

FIG. 6 illustrates the voltage swing at the output terminal OB1, OB2 of individual half-bridges operating between $+V_1$ and $-V_1$ and $+V_2$ and $-V_2$ respectively. The half-bridges are controlled based on the input signal $S_{IN}$ with the drive units and controls signal arrangements from FIGS. 3, 4a, and 4b. As seen, when the input signal $S_{IN}$ is high the duty cycle of the high-side switch of the first half-bridge is high meaning that the voltage at OB1 is $V_1$ for a large portion of the time. Inversely, when the input signal $S_{IN}$ is low the duty cycle of the high-side switch of the second half-bridge is high meaning that the voltage at OB2 is $V_2$ for a large portion of the time.

As seen, the difference between the OB1 and OB2 will follow a pulsed pattern which is characteristic for a full-bridge class D amplifier and which effectively doubles the amplitude of a half-bridge implementation. Additionally, it is noted that while the pulse frequency at the output terminals OB1, OB2 is still the switching frequency $f_s$ the difference signal combing the switching pattern of each half-bridge has a pulse frequency of twice the switching frequency, $2f_s$.

Figure 7A:
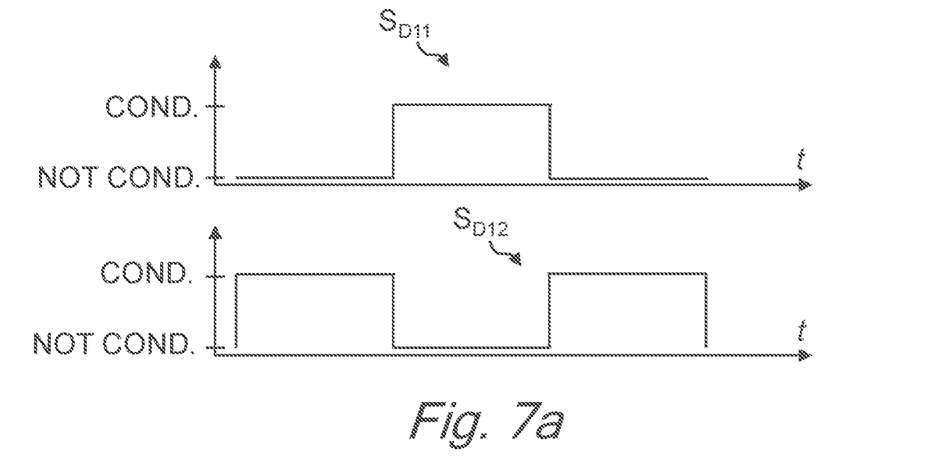
FIG. 7a illustrates two drive signals fed to each switch in a half-bridge wherein the drive signals are provided with a non-existent or very short dead-time.

FIG. 7a illustrates the complimentary drive signals $S_{D11}$, $S_{D12}$ created by the first drive unit for the switches of the first half-bridge. As seen, the signals $S_{D11}$, $S_{D12}$ are complimentary meaning that the high-side switch (controlled by $S_{D11}$) will be controlled to conduct when the low-side switch (controlled by $S_{D12}$) is not conducting. The control schedule of FIG. 7a is appropriate if the switches are ideal switches which respond instantaneously to the control signals $S_{D11}$, $S_{D12}$ and if the drive signals $S_{D11}$, $S_{D12}$ as such are perfect square waves with an infinite turn-on and turn-off rate. In practice, however, the switches will not respond infinitely fast, and the drive signals $S_{D11}$, $S_{D12}$ will feature a maximum and finite turn-on and turn-off rate which introduces simultaneous conduction that, to some extent, impedes the amplifier efficiency.

Figure 7B:
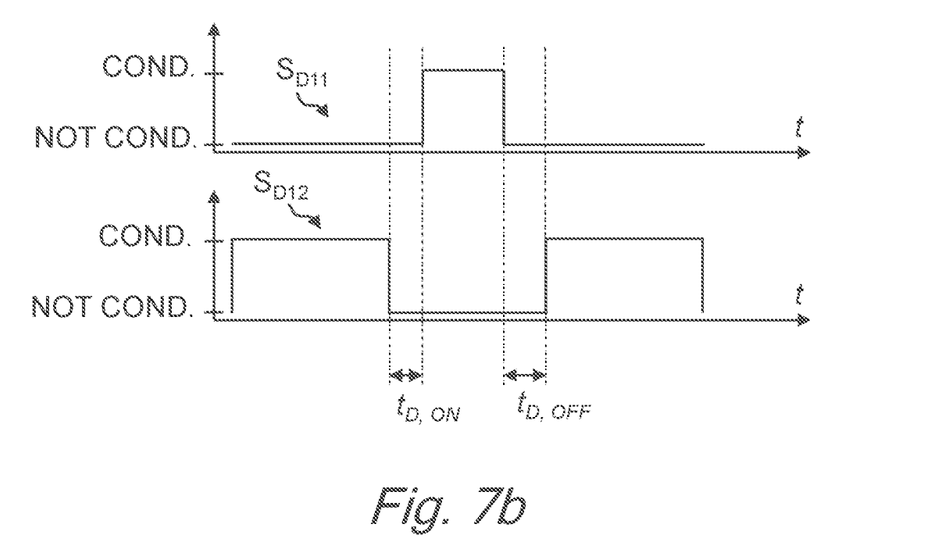
FIG. 7b illustrates two drive signals fed to each switch in a half-bridge wherein the drive signals are provided turn-on dead-time and a turn-off dead-time.

FIG. 7b illustrates that a dead time $t_{D, ON}$, $t_{D, OFF}$ can be introduced by the drive units wherein both switches are kept in the not conducting state for a predetermined period of time each time the drive unit switches from the high state to the low state or vice versa. In general, the dead time for switching from the low state to the high state $t_{D, ON}$ may be different and set individually from the dead time for switching from the high state to the low state to, OFF. In some implementations, however, the dead $t_{D, ON}$, $t_{D, OFF}$ is equal regardless of whether the switches are brought to the high state from the low state or vice versa.

While the dead time $t_{D, ON}$, $t_{D, OFF}$ can reduce the losses due to simultaneous conduction the dead time $t_{D, ON}$, $t_{D, OFF}$ will reduce the maximum amplitude and power output of the amplifier.

With the output circuit described in relation to FIG. 2a, 2b, 2c of the present invention the voltage and current flow at the output terminal of each half-bridge will be enforced by the output inductor such that zero voltage switching occurs at the switches with very short or non-existent dead time $t_{D, ON}$, $t_{D, OFF}$.

Figure 8A:
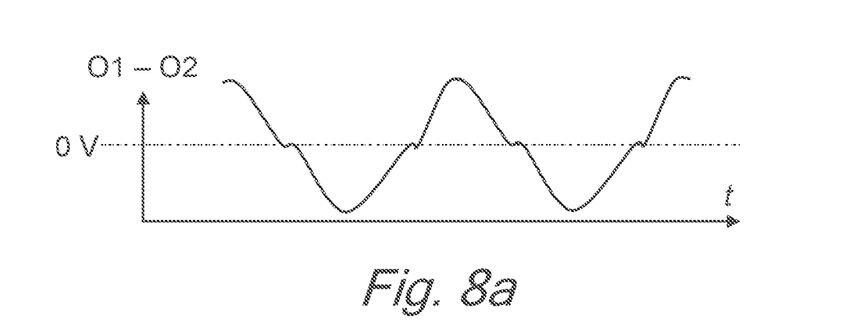
FIG. 8a illustrates an amplified output signal obtained with a full-bridge class D amplifier without output inductors.
Figure 8B:
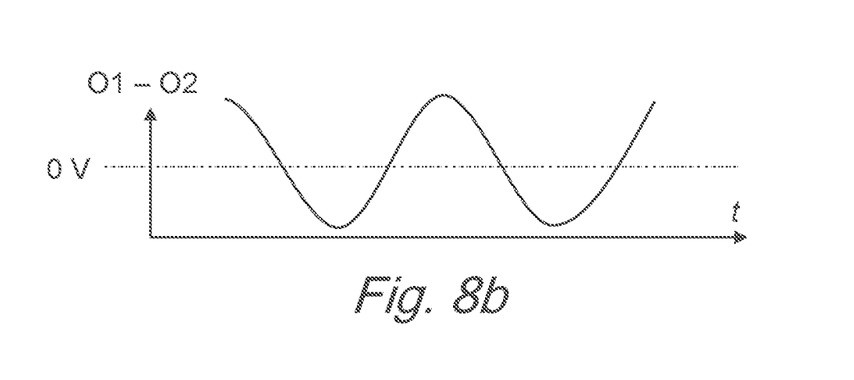
FIG. 8b illustrates an amplified output signal obtained with a full-bridge class D amplifier with output inductors according to one implementation of the present invention.

With reference to FIG. 1, FIG. 8a and FIG. 8b the output voltage between the output terminals O1, O2 is shown for a full-bridge class D amplifier 10 without the output inductors OL1, OL2 (FIG. 8a) and with the output inductors OL1, OL2 (FIG. 8b) respectively. The output signal shown in FIG. 8a and FIG. 8b is an amplified representation of a sinusoid input signal and, as seen by comparing the signals of FIG. 8a and FIG. 8b, the distortions are reduced when the output inductors OL1, OL2 are provided in the full-bridge class D amplifier 10. Especially, the distortions occurring when the input signal is at low-levels (i.e. at the inflexion points of the sinusoid) are reduced with the class D amplifier 10 of the present invention.

FIG. 8a and FIG. 8b also illustrate that the full-bridge class D amplifier 10 may be provided with symmetrical fed voltages, $+V_1$, $+V_2$, $-V_1$, $-V_2$ such that the amplified representation of the input will be centered around 0 volts. Although it is understood that any combination of feed voltages may be used feed voltages which are symmetrical and provide linear amplification are often preferred. Other combinations of fed voltages are possible tough, albeit these may influence the voltage around the output signal is centered and/or the provide amplitude dependent amplification of the input signal.

The person skilled in the art realizes that the present invention by no means is limited to the preferred embodiments described above. On the contrary, many modifications and variations are possible within the scope of the appended claims. For example, additional filter circuits may be placed between the output of the coupled coils and the amplifier output ports to enable further filtering of the output signals.

What is claimed is:

1. A full-bridge class D amplifier comprising:
   a first and second half-bridge circuit, wherein each half-bridge circuit comprises:
      a high-side switch and a low-side switch connected in series between high voltage port and a low voltage port,
      a half-bridge output terminal between the high-side and low-side switch, and
      wherein the high-side switch and low-side switch of each half-bridge circuit is configured to be switched between a conducting state and a non-conducting state, at a predetermined switching frequency, based on a first and second control signal respectively, such that for each half-bridge circuit one of the high-side switch and low-side switch is in the non-conducting state when the other one of the high-side switch and low-side switch is in the conducting state, and wherein the first and second control signal are configured to drive the first and second half-bridge circuits in differential mode,
      wherein each half-bridge circuit further comprises an output terminal inductor connected between the half-bridge output terminal and ground, the full-bridge class D amplifier further comprising:
a first and second coil, said first and second coil being coupled to form a common mode choke,
wherein the half-bridge output terminal of the first half-bridge is connected to an input terminal of the first coil, and
wherein the half-bridge output terminal of the second half-bridge is connected to an input terminal of the second coil,
wherein each of the first and second half-bridge circuits further comprises an output terminal capacitor connected between the output inductor and ground, and
wherein each of the first and second half-bridge circuits further comprises a snubber-circuit connected in parallel with the output capacitor.

2. The full-bridge class D amplifier according to claim 1, further comprising:
a first and second filter capacitor,
wherein the first filter capacitor is connected between an output terminal of the first coil and ground, and wherein the second filter capacitor is connected between an output terminal of the second coil and ground.

3. The full-bridge class D amplifier according to claim 2, wherein the first coil exhibits a first inductance,
wherein the second coil exhibits a second inductance, and
wherein the inductance of the first coil and the first filter capacitor forms a first low-pass filter and the inductance of the second coil and the second filter capacitor forms a second low-pass filter.

4. The full-bridge class D amplifier according to claim 3 wherein the cutoff frequency of the first and second low-pass filter is below the switching frequency.

5. The full-bridge class D amplifier according to claim 1, further comprising:
a common output capacitor connected between an output terminal of the first coil and an output terminal of the second coil.

6. The full-bridge class D amplifier according to claim 1, wherein the high-side switch and low-side switch of each half-bridge is connected in parallel with a respective flyback diode.

7. A full-bridge class D amplifier according to claim 1, wherein an output terminal of the first coil and an output terminal of the second coil are connected to a respective terminal of a loudspeaker.

8. A full-bridge class D amplifier system, comprising the full-bridge class D amplifier according to claim 1, the full-bridge class D amplifier system further comprising:
a control signal arrangement configured to generate the first and second control signal based on an input signal, wherein the first and second control signal comprises a plurality of pulses occurring with the switching frequency, and wherein a duty cycle of the pulses of the first and second control signal is based on the signal level of the input signal.

9. The full-bridge class D amplifier system according to claim 8, wherein the control system arrangement further comprises:
a reference signal generator, configured to generate a reference signal which is periodic with the switching frequency, and
a comparator, configured to compare the input signal with the reference signal and output a comparison signal, wherein the comparison signal has a first signal level if the input signal is higher than the reference signal and a second signal level if the reference signal is higher than the reference signal, and
wherein the duty cycle of pulses of the first and second control signal is based on the comparison signal.

10. The full-bridge class D amplifier system according to claim 9, wherein the reference signal is a sawtooth wave or a triangle wave.

11. The full-bridge class D amplifier system according to claim 8, further comprising:
a first drive unit associated with the first half-bridge circuit, and
a second unit associated with the second half-bridge circuit,
wherein the first and second drive unit is configured to generate a drive signal for the high-side switch and low-side switch, with the switching frequency, based on the duty cycle of the first and second control signal respectively.

12. The full-bridge class D amplifier system according to claim 11, wherein each drive unit is further configured to control the high-side switch and low-side switch to simultaneously be in the non-conductive state for a predetermined dead time.

* * * * *